United States Patent [19]

Yagyuu et al.

[11] Patent Number: 4,609,837
[45] Date of Patent: Sep. 2, 1986

[54] HIGH-SPEED LOGIC CIRCUIT WITH A CONSTANT CURRENT SOURCE ARRANGEMENT

[75] Inventors: Masayoshi Yagyuu; Hiroyuki Ito, both of Kokubunji, Japan

[73] Assignee: Hitachi, Ltd., Tokyo, Japan

[21] Appl. No.: 547,586

[22] Filed: Nov. 1, 1983

[30] Foreign Application Priority Data

Nov. 1, 1982 [JP] Japan .................... 57-190860

[51] Int. Cl.[4] .......... H03K 19/013; H03K 19/086; H03K 19/092; H03K 17/04
[52] U.S. Cl. ............................ 307/455; 307/475; 307/362
[58] Field of Search ............ 307/443, 454, 455, 358, 307/362, 363, 475, 270

[56] References Cited

U.S. PATENT DOCUMENTS

| | | | |
|---|---|---|---|
| 3,467,839 | 9/1969 | Miller | 307/455 X |
| 3,509,362 | 4/1970 | Bartholomew | 307/455 |
| 3,558,914 | 1/1971 | Schmidt | 307/455 |
| 3,573,488 | 4/1971 | Beelitz | 307/455 X |
| 4,249,091 | 2/1981 | Yamagiwa | 307/455 |
| 4,276,488 | 6/1981 | Benedict et al. | 307/455 X |

FOREIGN PATENT DOCUMENTS 2110029 6/1983 United Kingdom ............ 307/455

OTHER PUBLICATIONS

Braeckelmann et al., "A Masterslice LSI for Subnanosecond Random Logic", IEEE Journal of Solid State Circuits, vol. SC-14, No. 5, pp. 829-832, Oct. 79.
Wilhelm et al., "A New Circuit Technique in Voltage and Temperature Compensated ECL", Data Processing Program, Sign DV 3.001, ESSCIRC, 1976.

*Primary Examiner*—Stanley D. Miller
*Assistant Examiner*—David R. Bertelson
*Attorney, Agent, or Firm*—Antonelli, Terry & Wands

[57] ABSTRACT

A high-speed logic circuit including a logic part formed of a differential transistor circuit and a feedback part for feeding the in-phase output of the differential transistor circuit back to the out-of-phase input terminal of the differential transistor circuit is disclosed in which a constant current source circuit is provided in the feedback part to keep constant a current flowing through the feedback part.

40 Claims, 9 Drawing Figures

HIGH-SPEED LOGIC CIRCUIT WITH A CONSTANT CURRENT SOURCE ARRANGEMENT

The present invention relates to a digital logic circuit, and more particularly to a high-speed logic circuit suitable for use in the inner circuit, input circuit, or output circuit of an ultra-high-speed LSI used in a large computer.

Bipolar non-saturating logic circuits such as an emitter-coupled logic circuit (ECL) and a non-threshold logic circuit (NTL) have been mainly used to form an ultra-high-speed digital logic circuit required in the ultra-high-speed processor of a large computer.

The ECL is a threshold logic circuit in which an input signal is compared with a reference voltage to determine logic levels. The ECL can deliver both OR and NOR outputs and can form logic circuits such as the collector dot and the wired OR. Therefore, the ECL is a circuit having large logical-function capability. Further, it is possible to prevent the output signal levels of the ECL from being affected by supply-voltage variations and temperature variations, by varying the base potential of a transistor which is included in a current switching part to produce a constant current.

The NTL is a logic circuit in which an output signal varies linearly with an input signal and no clear threshold appears. Since the NTL has no threshold, it is high in switching speed, but only the NOR output is obtained in the NTL and only a wired OR circuit can be formed by adding an emitter follower to the NTL. Therefore the NTL is a circuit having small logical-function capability. Further, in order to make the output signal levels of the NTL independent of supply-voltage variations and temperature variations, a power source itself has to be stabilized, and a compensation circuit capable of supplying a large current is required. Accordingly, in the case where the NTL is used in a semiconductor chip including a large number of elements such as an LSI, it is very difficult to form the above-mentioned compensation circuit.

It is an object of the present invention to provide a high-speed logic circuit which has no threshold, is large in logical-function capability, and can readily prevent the output of the logic circuit from being affected by supply-voltage variations and temperature variations.

Prior to explaining a high-speed logic circuit according to the present invention, an example of non-threshold logic circuits having been previously proposed by the present applicant will be explained with reference to FIG. 1. The circuit shown in FIG. 1 is disclosed in a Japanese Patent Application No. 56-181141 filed on Nov. 13, 1981 and laid open on May 19, 1983 (Laid-open No. 58-83434), which corresponds to a U.S. patent application Ser. No. 441,180 filed on Nov. 12, 1982.

Referring to FIG. 1, in a differential transistor circuit including transistors $Q_1$, $Q_2$, $Q_3$ and $Q_4$, the collector output signal of the transistor $Q_4$ (namely, the in-phase output of the differential transistor circuit) is fed back to the base of the transistor $Q_4$ (namely, the out-of-phase input terminal of the differential transistor circuit) by means of first split resistors $R_{c01}$ and $R_{c02}$, a transistor $Q_6$ and second split resistors $R_1$ and $R_2$. It is a characteristic feature of the logic circuit shown in FIG. 1 that the generation of threshold is prevented by the above-mentioned negative feedback. An output signal of the logic circuit is delivered from the collector of the transistor $Q_4$ through an emitter-follower transistor $Q_5$. Further, another output signal (namely, an out-of-phase output) can be delivered from the common collector terminal of the transistors $Q_1$, $Q_2$ and $Q_3$ through another emitter-follower transistor, though such a circuit is not shown in FIG. 1.

The logic circuit shown in FIG. 1 is used as an input buffer circuit or output buffer circuit included in an LSI, and is used mainly for making the high logic level of output signal equal to the high logic level of input signal and making the low logic level of output signal different from the low logic level of input signal, that is, for obtaining a level shift effect.

Further, a feedback part made up of the transistor $Q_6$ and resistors $R_1$ and $R_2$ is connected to a negative power source $V_{TT}$ (namely, a power circuit), and the differential transistor circuit is connected to another negative power source $V_{EE}$ (namely, another power circuit). Generally speaking, the supply voltages of different power circuits included in an LSI vary independently of each other. This is because the external power source for supplying power to one of the power circuits is different from the external power source for supplying power to the other power circuit, and because a current path from a pad of the LSI connected with one of the external power sources to one of the power circuits and another current path from another pad connected with the other external power source to the other power circuit produce different voltage drops. Accordingly, the voltage fed back to the base of the transistor $Q_4$ varies in accordance with the difference between variations in supply voltage of the negative power source $V_{EE}$ and variations in supply voltage of the negative power source $V_{TT}$. Therefore, the output signal of the logic circuit is affected by the supply-voltage variations, and thus the level of the output signal fluctuates.

Further, in order to make the output signal of the logic circuit independent of temperature variations, the supply voltage itself has to be stabilized, as in the NTL. As mentioned previously, it is difficult to form a compensation circuit having desired capability.

In view of the above facts, a high-speed logic circuit according to the present invention is formed of a non-threshold circuit in which the in-phase output of a differential transistor circuit is fed back to the out-of-phase input terminal thereof, and the non-threshold circuit is provided in the feedback part thereof with a constant current source circuit to prevent the fed-back voltage from being affected by supply-voltage variations and temperature variations.

The present invention will be apparent from the following detailed description taken in conjunction with the accompanying drawings, in which.

Figure 1:
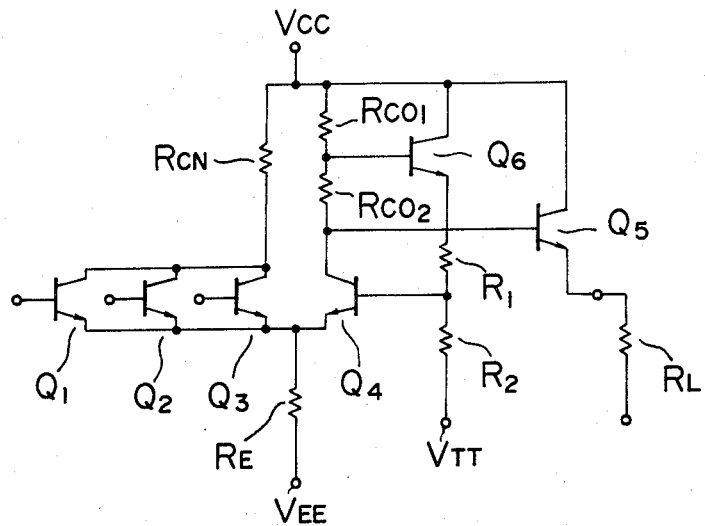
FIG. 1 is a circuit diagram showing a feedback-type non-threshold logic circuit.
Figure 2:
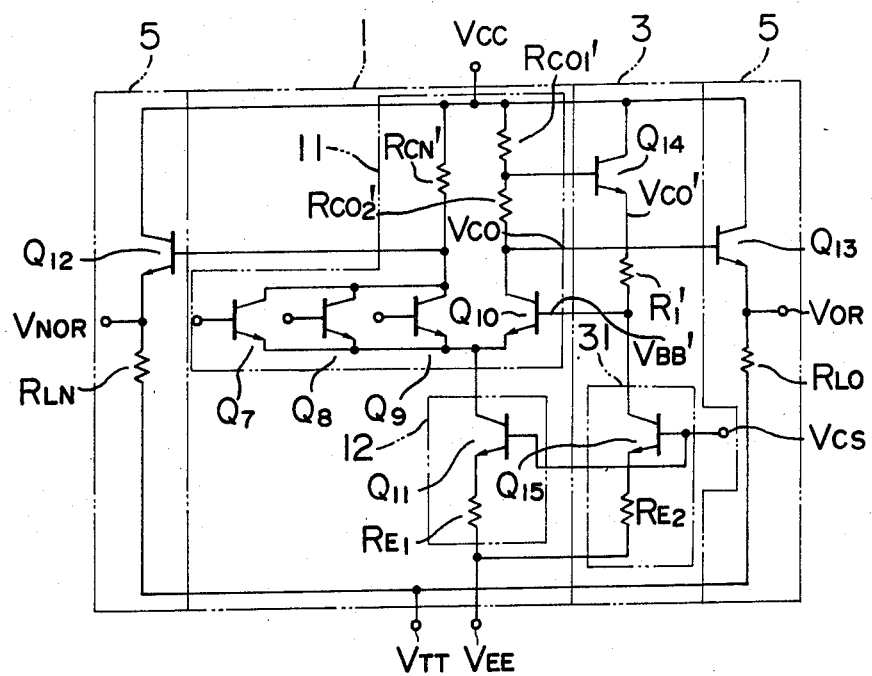
FIG. 2 is a circuit diagram showing an embodiment of a high-speed logic circuit according to the present invention.

Now, the present invention will be explained below in detail, on the basis of embodiments thereof. FIG. 2 shows the circuit configuration of an embodiment of a high-speed logic circuit according to the present invention. Referring to FIG. 2, the embodiment includes a ligic part 1, a feedback part 3 and a driver part 5. The logic part 1 includes transistors $Q_7$ to $Q_{11}$, and resistors $R_{CN}'$, $R_{CO1}'$, $R_{CO2}'$ and $R_{E1}$. The positive power source side of the logic part 1 is connected to a positive power source $V_{CC}$ (that is, is grounded), and the negative power source side of the logic circuit 1 is connected to a negative power source $V_{EE}$ having a voltage of, for example, $-3$ V. The transistor $Q_{11}$ and the resistor $R_{E1}$ form a constant current source circuit 12 for supplying a constant current to a differential transistor circuit 11 which includes the transistors $Q_7$ to $Q_{11}$ and the resistors $R_{CN}'$, $R_{CO1}'$ and $R_{CO2}'$. The feedback part 3 includes transistor $Q_{14}$ and $Q_{15}$ and resistors $R_1'$ and $R_{E2}$. The positive power source side and negative power source side of the feedback part 3 are connected to the power sources $V_{CC}$ and $V_{EE}$, respectively. The transistor $Q_{15}$ and the resistor $R_{E2}$ form a constant current source circuit 31, which supplies a constant current to the transistor $Q_{14}$ and resistor $R_1'$. The driver part 5 includes an emitter follower made up of a transistor $Q_{12}$ and a resistor $R_{LN}$, and another emitter follower made up of a transistor $Q_{13}$ and a resistor $R_{LO}$. The former and latter emitter followers are applied with the out-of-phase and in-phase outputs of the differential transistor circuit 11, respectively, and deliver output signals $V_{NOR}$ and $V_{OR}$. The positive power source side and negative power source side of the driver part 5 are connected to the positive power source $V_{CC}$ and a negative power source $V_{TT}$ having a voltage of, for example, $-1.8$ V, respectively.

In the present embodiment, a relation between the collector output voltage $V_{CO}$ of the out-of-phase input transistor $Q_{10}$ and the voltage $V_{BB}'$ fed back to the base of the transistor $Q_{10}$ is given by the following equations:

$$V_{CO'} = V_{CC} - \frac{R_{CO1}'}{R_{CO1}' + R_{CO2}'} (V_{CC} - V_{CO}) - V_{BE} \quad (1)$$

$$V_{BB'} = V_{CO'} - R_1' \cdot I_2 \quad (2)$$

$$= V_{CC} - \frac{R_{CO1}'}{R_{CO1}' + R_{CO2}'} (V_{CC} - V_{CO}) - V_{BE} - R_1' \cdot I_2$$

$$\frac{\partial V_{BB'}}{\partial V_{CO}} = \frac{R_{CO1}'}{R_{CO1}' + R_{CO2}'} \quad (3)$$

where $V_{CO'}$ indicates the voltage of the emitter of the transistor $Q_{14}$, $V_{BE}$ indicates the base-emitter voltage of the transistor $Q_{14}$, and $I_2$ is a current flowing through the resistor $R_1'$ and moreover a constant current as mentioned later. Further, in these equations and other equations mentioned later, $V_{CC}$ indicates the positive supply voltage and R's the resistance values of resistors.

As can be seen from the equation (3), a ratio of a change in the fed-back voltage $V_{BB'}$ caused by a change in the collector output voltage $V_{CO}$ of the transistor $Q_{10}$ to the change in the collector output voltage $V_{CO}$ (that is, a feedback ratio) can be controlled by a resistance ratio $R_{CO1}'/(R_{CO1}'+R_{CO2}')$. Further, as is evident from the circuit construction of the embodiment, the absolute value of the voltage $V_{BB'}$ fed back to the base of the transistor $Q_{10}$ can be adjusted independently of the feedback ratio, by changing the voltage drop across the resistor $R_1'$. Accordingly, the high and low logic levels of input signal can be made equal to the high and low logic levels of output signal, respectively. Further, a voltage change in input signal necessary for the level of output signal to begin to change, that is, an insensitive region can be readily varied by adjusting a ratio of the resistance of the resistor $R_{CO1}'$ to that of the resistor $R_{CO2}'$. Accordingly, the present embodiment can be used as the inner logic circuit of an LSI. Further, the present embodiment can be possessed of a level shift function by changing the resistance of each of the resistors $R_{CO1}'$, $R_{CO2}'$ and $R_1'$, and therefore can be used as the input buffer circuit or output buffer circuit of an LSI.

The logic part 1 and driver part 5 of the present embodiment have the same circuit structure as those of an ordinary ECL, and the logic part 1 and feedback part 3 of the present embodiment are connected to the same positive and negative power sources. Moreover, a reference voltage required in the ECL is not used in the present embodiment. Accordingly, when part of ECL's for forming the inner circuit of an LSI is replaced by the present embodiment, the inner circuit can be operated without making any alteration on a power supply system. Further, all of the ECL's for forming the inner circuit may be replaced by the present embodiment. Since the present embodiment is a non-threshold logic circuit, when part or all of ECL's for forming the inner circuit of an LSI are replaced by the present embodiment, an average signal-level switching speed in the LSI is improved, and therefore the performance of the LSI is increased.

Next, explanation will be made on how the influence of supply-voltage variations and temperature variations on the output signal of the present embodiment can be removed. Referring to FIG. 2, the constant current source circuit 31 made up of the transistor $Q_{15}$ and resistor $R_{E2}$ is provided in the feedback part 3, and the negative power source side of the feedback part 3 and that of the logic part 1 are connected to the same power source $V_{EE}$. Such a circuit structure makes it possible to prevent the level of output signal from being affected by variations in supply voltage $V_{EE}$ and variations in ambient temperature at a circuit operating time. First, the case where the supply voltage $V_{EE}$ varies, will be explained. When the supply voltage $V_{EE}$ varies by an amount $\Delta V_{EE}$, a current flowing through the transistor $Q_{14}$ and resistor $R_1'$ is kept unchanged if the base voltage $V_{CS}$ of the transistor $Q_{15}$ is changed by the same amount $\Delta V_{EE}$. Thus, the voltage $V_{BB'}$ fed back to the base of the transistor $Q_{16}$ can be kept constant independently of variations in suppy voltage $V_{EE}$.

Similar processing can be made for temperature variations. When ambient temperature varies, the base-emitter voltage of the transistor $Q_{15}$ varies in accordance with temperature variations and a value (hereinafter referred to as "$K_{15}$") which is determined by the emitter current density of the transistor $Q_{15}$. Accordingly, when a temperature change is detected and a voltage change determined by the temperature change and value $K_{15}$ is added to the base potential $V_{CS}$ of the transistor $Q_{15}$, a current flowing through the transistor $Q_{14}$ and resistor $R_1'$ can be kept constant independently of temperature variations. That is, the voltage $V_{BB'}$ fed back to the base of the transistor $Q_{10}$ can be made independent of temperature variations in a similar manner to the case where the supply voltage $V_{EE}$ varies. Further, in the case where the emitter current density of the transistor $Q_{14}$ is made equal to a mean emitter current density of each of the emitter-followered transistors $Q_{12}$ and $Q_{13}$, the output signals $V_{OR}$ and $V_{NOR}$ can be made independent of temperature variation in the same manner as the fed-back voltage $V_{BB}'$.

As mentioned above, by varying the base voltage of the transistor $Q_{15}$ included in the constant current source circuit 31, the voltage $V_{BB}'$ fed back to the base of the transistor $Q_{10}$ can be prevented from being affected by supply-voltage variations and temperature variations. Further, it becomes possible to make the output signals $V_{OR}$ and $V_{NOR}$ independent of the supply-voltage variations and temperature variations.

As mentioned previously, the present embodiment can be operated from the same power source as used for the ordinary ECL. In the ordinary ECL, a differential transistor circuit includes a constant current source circuit corresponding to the transistor $Q_{11}$ and resistor $R_{E1}$ of the present embodiment and the logic levels of output signal are made independent of supply-voltage variations and temperature variations in the same manner as in the feedback part 3 of the present embodiment. Accordingly, various bias generator circuits (namely, $V_{CS}$ generator circuits) for preventing the logic levels of output signal from being affected by supply-voltage variations and temperature variations have been known. Examples of the bias generator circuits are disclosed in, for example, an article entitled "A new circuit technique in voltage and temperature compensated emitter-coupled logic" by W. Wilhelm et al. (Proc. ESCIRC, 1976, Paper No. A2.4), and an article entitled "A Masterslice LSI for Subnanosecond Random Logic" by W. Braeckelmann et al. (IEEE J. Solid-State Circuits Vol. SC-14, 1979, pp. 829 to 832). Needless to say, the $V_{CS}$ generator circuits disclosed in the above articles are applicable to the present embodiment.

In the present embodiment, in order that the current flowing through the logic part 1 and the current flowing through the feedback part 3 are made independent of supply-voltage-variations and temperature variations by using a single bias generator circuit, the negative power source side of the logic part 1 and that of the feedback part 3 are connected to the common power source $V_{EE}$, and the base of the transistor $Q_{11}$ for supplying a constant current to the differential transistor circuit 11 of the logic part 1 and the large of the transistor $Q_{15}$ for generating a constant current in the feedback part 3 are connected in common. Since the common negative supply voltage $V_{EE}$ is applied to the constant current source circuits 12 and 31, the current flowing through the transistor $Q_{11}$ and the current flowing through the transistor $Q_{15}$ can be made constant independently of variations in supply voltage $V_{EE}$ by supplying a $V_{CS}$ terminal with the same voltage change as a change $\Delta V_{EE}$ is supply voltage $V_{EE}$. When the present emboiment is designed so that the transistors $Q_{11}$ and $Q_{15}$ have the same emitter current density, the temperature coefficient $K_{11}$ of the base-emitter voltage of the transistor $Q_{11}$ is equal to the temperature coefficient $K_{15}$ of the base-emitter voltage of the transistor $Q_{15}$. Accordingly, the base potentials of the transistors $Q_{11}$ and $Q_{15}$ are changed by the same voltage in making temperature compensation, that is, the bases of these transistors can be connected to a common base terminal. Thus, the same bias generator circuit can be used in the logic part 1 and feedback part 3 to make the voltage and temperature compensation.

In the case where the logic part 1 and the feedback part 3 are not required to use a bias generator circuit in common, the base of the transistor $Q_{11}$ included in the logic part 1 and the base of the transistor $Q_{15}$ included in the feedback part 3 are not required to be connected in common, and the logic part 1 and the feedback part 3 are not required to be connected to the same negative power source. In such a case, a negative supply voltage applied to the feedback part 3 can be made lower than a negative supply voltage applied to the logic part 1, and power consumption in the feedback part 3 can be reduced.

Further, the use of the transistor $Q_{15}$ improves the switching speed of the present embodiment. In more detail, the base terminal of the transistor $Q_{10}$ has a larger capacitance, as compared with the case where the constant current source circuit 31 is replaced by a resistor. Such an increase in capacitance is caused by the base-collector capacitance and collector-substrate capacitance of the transistor $Q_{15}$, and makes slower the time variation of the voltage $V_{BB}'$ at the base of the transistor $Q_{10}$ as compared with the case where such an increase in capacitance is not present. Accordingly, when the logic level of input signal changes from high to low, or from low to high, the reference voltage $V_{BB}'$ of the differential transistor circuit has a hysteresis characteristic with respect to time. This hysteresis characteristic acts so as to make high the switching speed of the differential transistor circuit. Accordingly, the switching speed of the present embodiment can be made higher, as compared with the case where the transistor $Q_{15}$ is not used. Further, in order to enhance such an effect, a load may be intentionally connected to the base of the transistor $Q_{10}$. In this case, it is determined by transistor parameters and power consumption in a circuit part relevant to the load how much capacitance is required for the load, but it is usually desirable to use a load having a capacitance of hundreds of femtofarads. The load having such a capacitance can be formed of a parallel-plate capacitor, a reverse-biased diode, and others.

As is apparent from FIG. 2, two output signals $V_{OR}$ and $V_{NOR}$ which are opposite in polarity to each other, are delivered from the present embodiment. Though three inputs are shown in FIG. 2, the present embodiment can receive four or more inputs in the same manner as the ordinary ECL. Further, since the output signal $V_{OR}$ and $V_{NOR}$ are delivered from the emitter followers, a wired OR circuit can be formed at the output portion of the present embodiment.

In the present embodiment, the constant current source circuit 31 of the feedback part 3 is made up of the transistor $Q_{15}$ and resistor $R_{E2}$. The voltage and temperature compensation as well as an increase in switching speed which are achieved by using the constant current source circuit 31, have been explained in the above description. However, in the case where a voltage applied across the constant current source circuit 31, that is, a difference between the voltages $V_{BB}'$ and $V_{EE}$ is sufficiently large, a constant current characteristic and a compensation characteristic substantially equal to those obtained when the constant current source circuit 31 is used, are obtained by using an appropriate resistor in place of the circuit 31. Accordingly, when the absolute value of the negative supply voltage $V_{EE}$ is sufficiently high, a resistor can be used in place of the transistor $Q_{15}$ and resistor $R_{E2}$.

Figure 3:
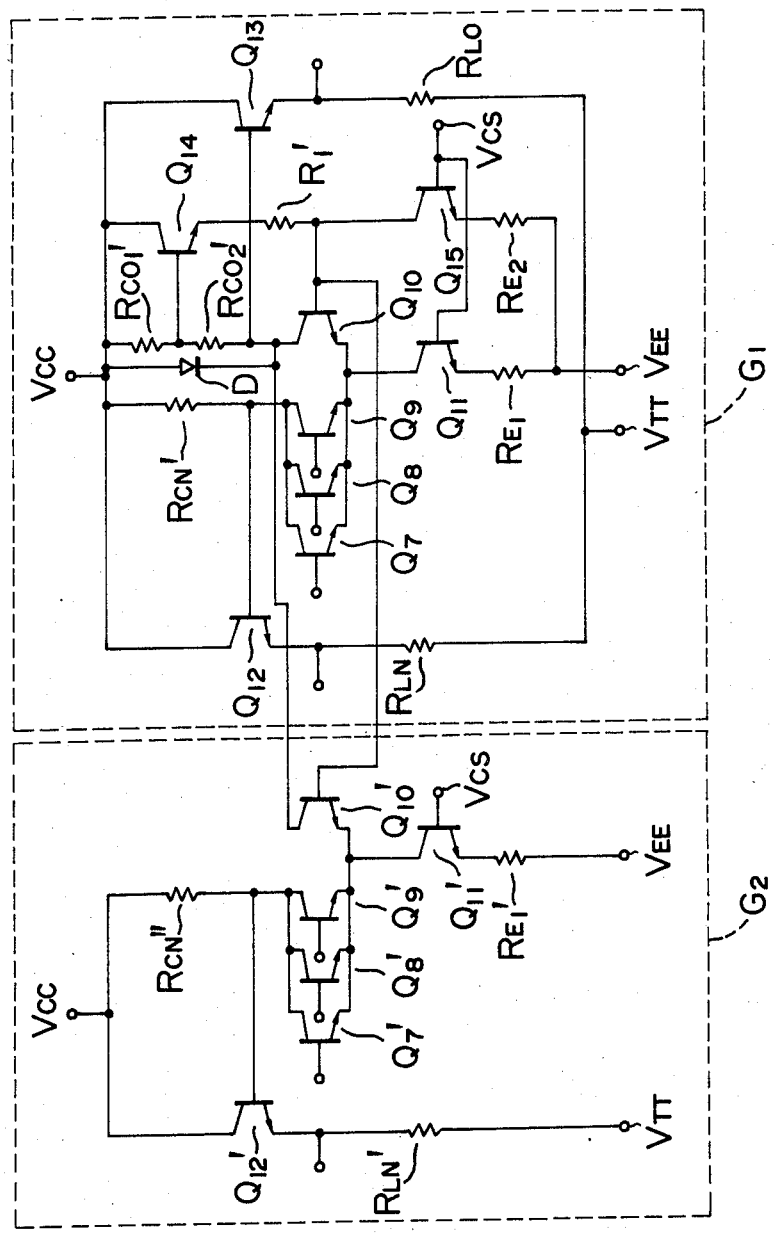
FIGS. 3 and 4 are circuit diagrams showing another and a further embodiments of a high-speed logic circuit according to the present invention.

FIG. 3 shows another embodiment of a high-speed logic circuit according to the present invention, in which a collector dot circuit is formed. In FIG. 3, a circuit part G1 is the same circuit as shown in FIG. 2, and another circuit part G2 has such a structure as obtained by removing the resistors $R_{CO1}'$, $R_{CO2}'$, $R_1'$ and $R_{E2}$ and transistor $Q_{14}$ and $Q_{15}$ from the circuit shown in FIG. 2. As shown in FIG. 3, the collector of the transistor $Q_{10}$ included in the circuit part G1 and the collector of a transistor $Q_{10}'$ included in the circuit part G2 are connected in common and the base of the transistor $Q_{10}$ and the base of the transistor $Q_{10}'$ are connected in common, to form a collector dot circuit between the circuit parts G1 and G2. Though only two circuit parts are shown in FIG. 3, it is evident that three or more circuit parts can be combined in a similar manner, to form a collector dot circuit. When a plurality of circuit parts are combined to form a collector dot circuit, a voltage drop across the resistors $R_{CO1}'$ and $R_{CO2}'$ becomes too large, and the collector potential of the transistor $Q_{10}$ falls greatly. A PN diode D connected in parallel to the resistors $R_{CO1}'$ and $R_{CO2}'$ can prevent such a fall in collector potential of the transistor $Q_{10}$. Though the collector potential of the transistor $Q_{10}$ is clamped by the PN diode in FIG. 3, the PN diode may be replaced by a Schottky diode and others.

Figure 4:
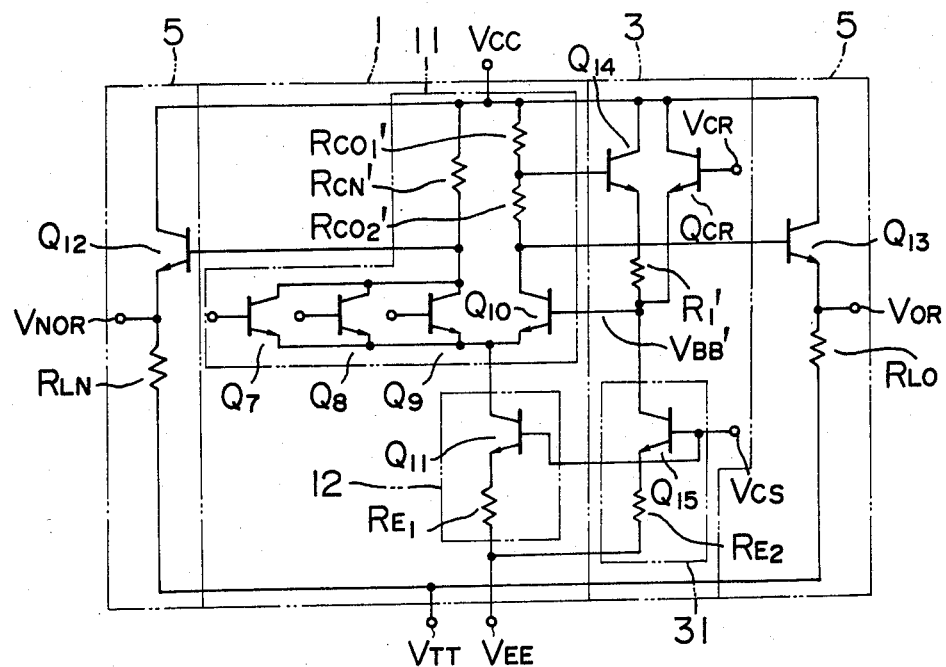

FIG. 4 is a circuit diagram showing a further embodiment of a high-speed logic circuit according to the present invention. The circuit shown in FIG. 4 has a structure that a transistor $Q_{CR}$ is added to the circuit shown in FIG. 2. The collector of the transistor $Q_{CR}$ is connected to the positive power source $V_{CC}$, and the emitter of the transistor $Q_{CR}$ is connected to the common connecting point of the resistor $R_1'$, the base of the transistor $Q_{10}$ and the collector of the transistor $Q_{15}$. Further, the base of the transistor $Q_{CR}$ is applied with a bias potential $V_{CR}$.

Such connections of the transistor $Q_{CR}$ produce two effects. The first effect is that a speed-up capacitance is given by the transistor $Q_{CR}$. As mentioned previously, the delay time of the embodiment can be made short by making slow the response of the voltage $V_{BB}'$ to input pulse. In the circuit structure shown in FIG. 4, the base-emitter capacitance of the transistor $Q_{CR}$ and electric charge accumulated on the base of the transistor $Q_{CR}$ act as a speed-up capacitance.

Figure 5A:
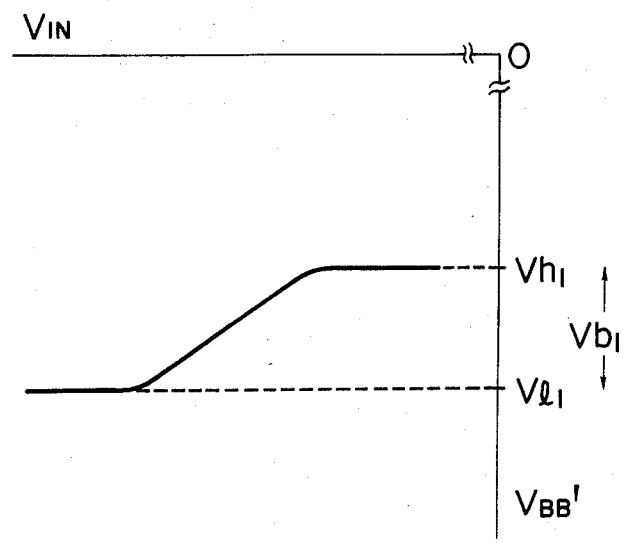
FIGS. 5a and 5b are graphs for explaining the effect of the embodiment shown in FIG. 4.

The second effect is that, when a collector dot circuit is formed using the present embodiment, a low-logic-level noise margin is increased. This effect will be explained below, with reference to FIGS. 5a and 5b. FIG. 5a shows a relation between $V_{IN}$ and $V_{BB}'$ in the embodiment shown in FIG. 2, where $V_{IN}$ indicates the base potential of one of the transistors $Q_7$ to $Q_9$, and $V_{BB}'$ the base potential of the transistor $Q_{10}$. When a constant current flowing through the transistor $Q_{11}$ and another constant current flowing through the transistor $Q_{15}$ are expressed by $I_1$ and $I_2$, respectively, the high and low logic levels $V_{h1}$ and $V_{l1}$ of the potential $V_{BB}'$ are given by the following equations:

$$V_{h1} = V_{CC} - V_{BE} - R_1' \cdot I_2 \quad (4)$$

$$V_{l1} = V_{CC} - R_{CO1}' \cdot I_1 - V_{BE} - R_1' \cdot I_2 \quad (5)$$

where $V_{BE}$ indicates the base-emitter voltage of the transistor $Q_{14}$. Further, from the equations (4) and (5), we obtain the difference $V_{b1}$ between the logic levels $V_{h1}$ and $V_{l1}$ as follows:

$$V_{b1} = R_{CO1}' \cdot I_1 \quad (6)$$

When a collector dot circuit is formed using such a circuit as shown in FIG. 2, a voltage drop across the resistors $R_{CO1}'$ and $R_{CO2}'$ varies depending upon how many switching currents flow on the OR-side. In order to prevent the above variation, a clamping diode is usually connected in parallel to the resistors $R_{CO1}'$ and $R_{CO2}'$ in forming a collector dot circuit. A fall in the low logic level of the OR-output caused by forming a collector dot circuit is decreased by using the clamping diode, but the effect of the diode is not satisfactory. Accordingly, in the case where a collector dot circuit is formed, the low logic level of the OR-output is about 100 mV lower than that obtained in the case where the collector dot circuit is not formed. In an ECL, a fall in the low logic level of output increases a noise margin. Accordingly, an ECL circuit in which the low logic level of output has fallen, can be used as a logic circuit as it is, though the delay time of the circuit is a little longer. However, in the embodiment shown in FIG. 2, an increase in voltage drop across the resistor $R_{CO1}'$ lowers the potential $V_{BB}'$, and decreases a low-logic-level noise margin when a collector dot circuit is formed.

Figure 5B:
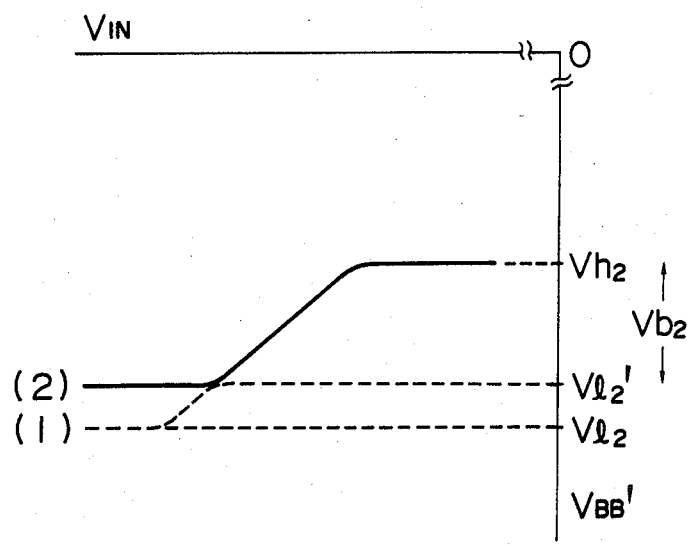

FIG. 5b shows a relation between $V_{IN}$ and $B_{BB}'$ in the embodiment shown in FIG. 4. Two logic levels $V_{h2}$ and $V_{l2}$ shown in FIG. 5b are given by the following equations:

$$V_{h2} = V_{CC} - V_{BE} - R_1' \cdot I_2 \quad (7)$$

$$V_{l2} = V_{CC} - R_{CO1}' \cdot I_1 - V_{BE} - R_1' \cdot I_2 \quad (8)$$

Further, a logic level $V_{l2}'$ shown in FIG. 5b is determined by the base potential and base-emitter voltage of the transistor $Q_{CR}$, and is given as follows:

$$V_{l2}' = V_{CR} - V_{BE}' \quad (9)$$

where $V_{BE}'$ indicates the base-emitter voltage of the transistor $Q_{CR}$, and $V_{CR}$ the base potential thereof. The D.C. operation of the embodiment shown in FIG. 4 is different from that of the embodiment shown in FIG. 2 in that a low logic level of the potential $V_{BB}'$ is made equal to the level $V_{l2}'$ independently of the voltage drop across the resistor $R_{CO1}'$ and thus is kept unchanged when a collector dot circuit is formed. In FIG. 5b, a curve (1) indicates the locus of potential $V_{BB}'$ in the case where the transistor $Q_{CR}$ is absent, and a curve (2) the locus of $V_{BB}'$ in the case where the transistor $Q_{CR}$ is provided.

As has been explained in the above, a decrease in low-logic-level noise margin produced when a collector dot circuit is formed, can be prevented by using the embodiment shown in FIG. 4. Accordingly, a collector dot circuit using the embodiment shown in FIG. 4 can be operated with a smaller signal amplitude, as compared with a collector dot circuit using the embodiment shown in FIG. 2.

Figure 6:
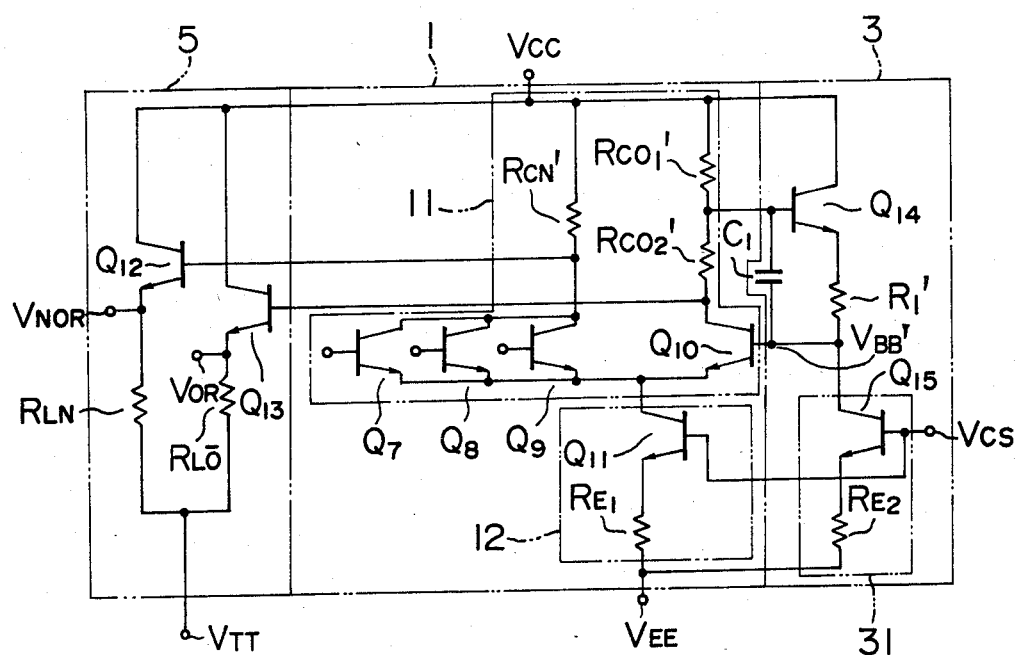
FIG. 6 is a circuit diagram showing still another embodiment of a high-speed logic circuit according to the present invention.

FIG. 6 shows still another embodiment of a high-speed logic circuit according to the present invention. In a high-speed logic circuit according to the present invention, current-switchover noise due to the transition of an input signal from a high logic level to a low logic level or from the low logic level to the high level appears at the base of the out-of-phase input transistor $Q_{10}$, as in the ECL. The above noise is remarkable when a circuit impedance determining the base potential of the transistor $Q_{10}$ is large. This holds not only for the ECL but also for the high-speed logic circuit according to the preent invention. When the noise is large, the current switching at the out-of-phase input transistor $Q_{10}$ is delayed, and the switching speed of the logic circuit is slow. In the conventional ECL, in order to solve the above problem, a large capacitance is additionally given to the base of the out-of-phase input transistor $Q_{10}$ so that the base potential of the transistor $Q_{10}$ is not varied by the noise due to the current switching of the transistor $Q_{10}$.

In a high-speed logic circuit according to the present invention, the base potential of the out-of-phase input transistor $Q_{10}$ is supplied through a negative feedback circuit, and therefore the response of the base potential of the transistor $Q_{10}$ to input signal will become slow, if an electrostatic capacitance is simply given to the base of the transistor $Q_{10}$. Accordingly, the logic circuit having such an electrostatic capacitance cannot be used in the case where a pulse signal having a high repetition frequency is processed.

In order to prevent noise due to current switching from appearing at the base of the transistor $Q_{10}$ and to make rapid the response of the base potential of the transistor $Q_{10}$, a method such as shown in FIG. 6 is used. The embodiment shown in FIG. 6 is different from the embodiment shown in FIG. 2 in that a capacitor $C_1$ (that is, an electrostatic capacitance) is connected as illustrated.

The effect of the capacitor $C_1$ will be explained below. The emitter of the out-of-phase input transistor $Q_{10}$ and the emitters of the input transistors $Q_7$ to $Q_9$ are connected in common, and each switching operation of the transistor $Q_{10}$ starts at the emitter thereof. The capacitor $C_1$ is connected between the base of the transistor $Q_{10}$ and the connecting point of the load resistors $R_{CO1}'$ and $R_{CO2}'$. The response of the collector of the transistor $Q_{10}$ to input signal is more delayed, as compared with the response of the base of the transistor $Q_{10}$ to input signal. Therefore, when the transistor $Q_{10}$ begins to perform a current switching operation in such a manner that the operation starts at the emitter of the transistor $Q_{10}$, the potential of the connecting point of the resistors $R_{CO1}'$ and $R_{CO2}'$, *that is, the potential of one end terminal of the capacitor $C_1$* is at first kept unchanged. Accordingly, the impedance viewed from the base of the transistor $Q_{10}$ is decreased by the capacitor $C_1$, and noise is hard to appear. Thus, the switching speed of the circuit is increased. When the collector of the transistor $Q_{10}$ begins to respond to an input signal, the potential of the connecting point of the resistors $R_{CO1}'$ and $R_{CO2}'$ begins to change. A change in the above potential is fed back to the transistor $Q_{10}$ through the transistor $Q_{14}$ and resistor $R_1'$ which make up a negative feedback circuit. If the feedback operation is performed slowly, it will be impossible to process a pulse signal having a high repetition frequency. In the present embodiment, the capacitor $C_1$ is connected between the base of the transistor $Q_{10}$ and the base of the transistor $Q_{14}$. Further, the potential drop between the base of the transistor $Q_{10}$ and the base of the transistor $Q_{14}$ is essentially kept nearly constant for the feedback period. Therefore, the capacitor $C_1$ connected between these bases does not reduce the feedback speed. Accordingly, the present embodiment can respond satisfactorily to a pulse signal having a high repetition frequency.

Figure 7:
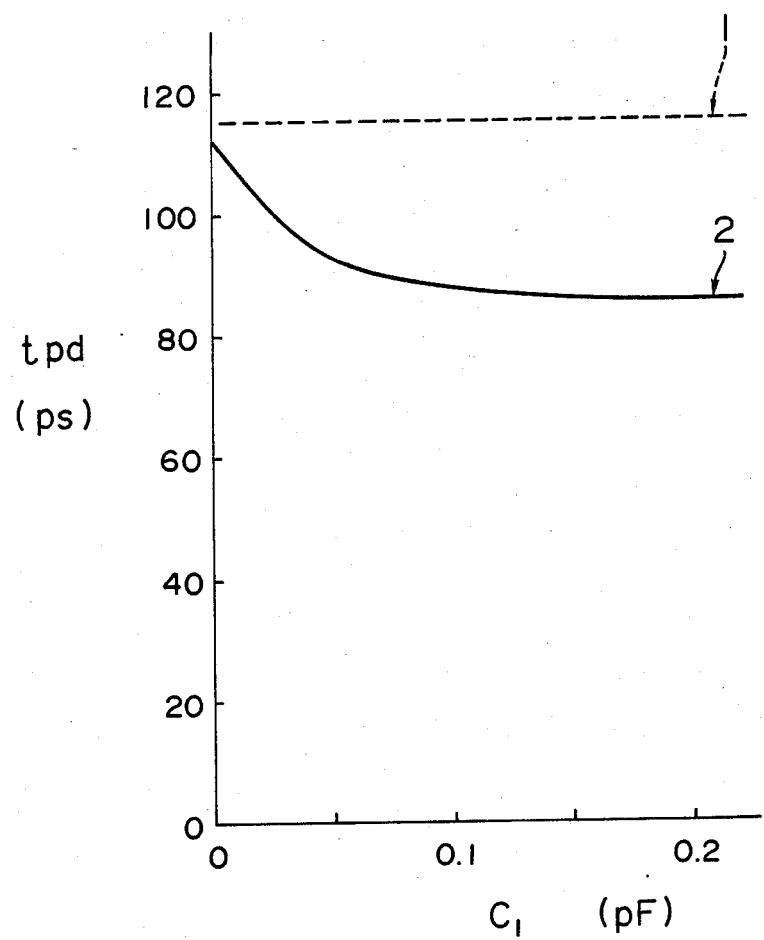
FIG. 7 is a graph for explaining the effect of the embodiment shown in FIG. 6.

FIG. 7 shows an improvement in operating speed of the embodiment shown in FIG. 6 which depends upon the capacitance of the capacitor $C_1$, and data shown in FIG. 7 have been obtained by means of circuit simulation. In FIG. 7, the abscissa indicates the electrostatic capacitance of the capacitor $C_1$, and the ordinate the delay time of logic circuit. Further, a broken line 1 and a solid line 2 shown in FIG. 7 indicate the characteristic of a conventional ECL and the characteristic of the embodiment shown in FIG. 6, respectively. In the case where the capacitor $C_1$ has a capacitance of 0.1 to 0.2 $\mu F$, the delay time of the present embodiment is about 70% of that of the conventional ECL. If the capacitance is made equal to 0 $\mu F$, the delay time of the embodiment will be only a little shorter than that of the ECL. However, even if the embodiment does not include the capacitor $C_1$, a parasitic capacitance of about 0.05 $\mu F$ is present, and the delay time of the embodiment is about 80% of that of the ECL.

Figure 8:
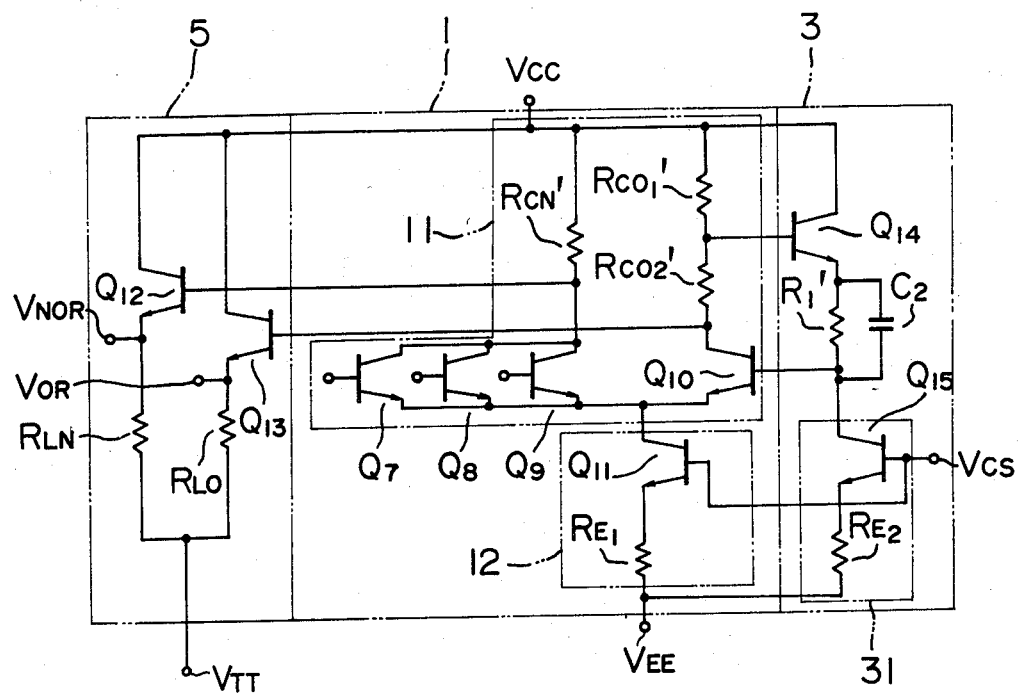
FIG. 8 is a circuit diagram showing still a further embodiment of a high-speed logic circuit according to the present invention.

FIG. 8 shows still a further embodiment of a high-speed logic circuit according to the present invention which can produce the same effect as the embodiment shown in FIG. 6. In the present embodiment, a parallel combination of a capacitor $C_2$ and the resistor $R_1'$ is connected between the base of the transistor $Q_{10}$ and the emitter of the transistor $Q_{14}$. The present embodiment has substantially the same operating speed as the embodiment shown in FIG. 6.

In the foregoing description, the present invention has been explained on the premise that a logic circuit according to the present invention is used as an inner circuit of an LSI. It is evident that the logic circuit can be used an output circuit or input circuit of the LSI.

As has been explained in the foregoing, according to the present invention, a non-threshold logic circuit is obtained which has substantially the same logical-function capability as an ECL, can prevent an output signal from being affected by supply-voltage variations and temperature variations, can coexist with the ECL, and is higher in operating speed than the ECL.

We claim:

1. A high-speed logic circuit comprising:
   a logic part comprised of a differential transistor circuit for comparing an input signal with a reference voltage;
   a feedback circuit for receiving an in-phase output from said differential transistor circuit which output is logically in-phase to the input signal, and supplying an output signal to said differential transistor circuit as the reference voltage, said feedback circuit including a first transistor having a base applied with the in-phase output of said differential transistor circuit, and a first resistor coupled at one end thereof to an emitter of said first transistor, wherein the output signal of said feedback circuit serving as the reference voltage is generated at the other end of said first resistor;
   a constant current source circuit connected between the other end of said first resistor and a power source for supplying a predetermined first voltage; and
   electrostatic capacitance means coupled between the base of said first transistor and a point at which said differential transistor circuit receives the output signal of said feedback circuit.

2. A high-speed logic circuit according to claim 1, wherein said differential transistor circuit further comprises:
at least one in-phase input transistor having a base for receiving said input signal;
an out-of-phase input transistor having an emitter coupled to an emitter of said in-phase input transistor, and a base for receiving the output signal of said feedback circuit;
a resistor connected between a collector of said in-phase input transistor and a power source for supplying a predetermined second voltage higher than said first voltage; and
split resistors connected between a collector of said out-of-phase input transistor and the power source for supplying the second voltage, the in-phase output of said differential transistor circuit being extracted from the split resistors.

3. A high-speed logic circuit according to claim 2, wherein said constant current source circuit is formed of a series combination of a second transistor and a second resistor, and said series combination is connected between the other end of said first resistor and the power source for supplying the first voltage.

4. A high-speed logic circuit according to claim 1, wherein each of said logic part and said feedback circuit is connected between the first and second voltage power sources.

5. A high-speed logic circuit according to claim 1, further comprising a first emitter-follower transistor applied with a collector signal of an out-of-phase input transistor which is included in said differential transistor circuit.

6. A high-speed logic device according to claim 5, further comprising a second emitter-follower transistor applied with a collector signal of at least one in-phase input transistor which is included in said differential transistor circuit.

7. A high-speed logic circuit according to claim 3, futher comprising means for supplying a bias voltage to the base of said second transistor to prevent the output of said differential transistor circuit from being affected by supply-voltage variations and temperature variations.

8. A high-speed logic circuit according to claim 2, wherein said logic part includes a constant current source circuit coupled between said differential circuit and the first voltage power source for supplying constant current to said differential transistor circuit.

9. A high-speed logic circuit comprising:
a logic part comprised of a differential transistor circuit for comparing an input signal with a reference voltage;
a feedback circuit for receiving an in-phase output from said differential transistor circuit which output is logically in-phase to the input signal, and supplying an output signal to said differential transistor circuit as the reference voltage, said feedback circuit including a first transistor having a base applied with the in-phase output of said differential transistor circuit, and a first resistor coupled at one end thereof to an emitter of said first transistor, wherein the output signal of said feedback circuit serving as the reference voltage is generated at the other end of said first resistor;
a constant current source circuit connected between the other end of said first resistor and a power source for supplying a predetermined first voltage; and
electrostatic capacitance means coupled between the emitter of said first transistor and a point at which said differential transistor circuit receives the output signal of said feedback circuit.

10. A high-speed logic circuit according to claim 9, wherein said differential transistor circuit further comprises:
at least one in-phase input transistor having a base for receiving said input signal;
an out-of-phase input transistor having an emitter coupled to an emitter of said in-phase input transistor, and a base for receiving the output signal of said feedback circuit;
a resistor connected between a collector of said in-phase input transistor and a power source for supplying a predetermined second voltage higher than said first voltage; and
split resistors connected between a collector of said out-of-phase input transistor and the power source for supplying the second voltage, the in-phase output of said differential transistor circuit being extracted from the split resistors.

11. A high-speed logic circuit according to claim 10, wherein said constant current source circuit is formed of a series combination of a second transistor and a second resistor, and said series combination is connected between the other end of said first resistor and the power source for supplying the first voltage.

12. A high-speed logic circuit according to claim 9, wherein each of said logic part and said feedback circuit is connected between the first and second voltage power sources.

13. A high-speed logic circuit according to claim 9, further comprising a first emitter-follower transistor applied with a collector signal of an out-of-phase input transistor which is included in said differential transistor circuit.

14. A high-speed logic device according to claim 13, further comprising a second emitter-follower transistor applied with a collector signal of at least one in-phase input transistor which is included in said differential transistor circuit.

15. A high-speed logic circuit according to claim 11, further comprising means for supplying a bias voltage to the base of said second transistor to prevent the output of said differential transistor circuit from being affected by supply-voltage variations and temperature variations.

16. A high-speed logic circuit according to claim 10, wherein said logic part includes a constant current source circuit provided between said differential transistor circuit and the first voltage power source for supplying constant current to said differential transistor circuit.

17. A high-speed logic circuit comprising:
a logic part including a differential transistor circuit for comparing an input signal with a reference voltage to provide an in-phase output, and a constant current source for supplying constant current to said differential transistor circuit;
a feedback part for providing negative feedback of the in-phase output of said differential transistor circuit, said feedback part including a first transistor applied with the in-phase output of said differential transistor circuit, a first resistor connected at one end thereof to the emitter of said first transistor and at the other end thereof to the base of a phase-shifting input transistor included in said differential transistor circuit and a constant current source for keeping the current flowing through said first transistor and said first resistor constant; and a capacitance provided between the base of said phase-shifting input transistor and a predetermined point in said feedback part, a potential difference between the base of said phase-shifting input transistor and said point being kept substantially constant.

18. A circuit as claimed in claim 17, wherein said capacitance is coupled between the base of said phase-shifting input transistor and the base of said first transistor.

19. A circuit as claimed in claim 17, wherein said capacitance is coupled between the base of said phase-shifting input transistor and the emitter of said first transistor.

20. A circuit as claimed in claim 17, further comprising a second transistor coupled in parallel to said first transistor and said first resistor.

21. A circuit as claimed in claim 17, wherein said logic part and said feedback part are coupled between a common negative power source and a common positive power source.

22. A circuit as claimed in claim 21, wherein said logic part constant current source is formed of a series combination of a third transistor and a second resistor for supplying current to said differential transistor circuit, and said feedback part constant current source is formed of a series combination of a fourth transistor and a third resistor, wherein said third and fourth transistors have substantially the same emitter current density.

23. A circuit as claimed in claim 17, further comprising a first emitter-follower transistor applied with the collector signal of said phase-shifting input transistor and a second emitter-follower transistor applied with the collector signal of in-phase input transistors included in said differential transistor circuit; said first transistor having substantially the same emitter current density as each of said first and second emitter-follower transistors.

24. A high-speed logic circuit according to claim 17, wherein said differential transistor circuit further comprises:
at least one in-phase input transistor having a base for receiving said input signal;
an out-of-phase input transistor having an emitter coupled to an emitter of said in-phase input transistor, and a base for receiving the output signal of said feedback part;
a resistor connected between a collector of said in-phase input transistor and a power source for supplying a predetermined voltage; and
split resistors connected between a collector of said out-of-phase input transistor and the power source, wherein the in-phase output of said differential transistor circuit is extracted from the split resistors.

25. A high-speed logic circuit comprising:
a logic part comprised of a differential transistor circuit for comparing an input signal with a reference voltage;
a feedback circuit for receiving an in-phase output from said differential transistor circuit which output is logically in-phase to the input signal, and supplying an output signal to said differential transistor circuit as the reference voltage, said feedback circuit including a first transistor having a base applied with the in-phase output of said differential transistor circuit, and a first resistor coupled at one end thereof to an emitter of said first transistor, wherein the output signal of said feedback circuit serving as the reference voltage is generated at the other end of said first resistor;
a constant current source circuit connected between the other end of said first resistor and a power source for supplying a predetermined first voltage; and
another transistor connected in parallel to a combination of said first transistor and said first resistor.

26. A high-speed logic circuit according to claim 25, wherein said differential transistor circuit further comprises:
at least one in-phase input transistor having a base for receiving said input signal;
an out-of-phase input transistor having an emitter coupled to an emitter of said in-phase input transistor, and a base for receiving the output signal of said feedback circuit;
a resistor connected between a collector of said in-phase input transistor and a power source for supplying a predetermined second voltage higher than said first voltage; and
split resistors connected between a collector of said out-of-phase input transistor and the power source for supplying the second voltage, the in-phase output of said differential transistor circuit being extracted from the split resistors.

27. A high-speed logic circuit according to claim 26, wherein said constant current source circuit is formed of a series combination of a second transistor and a second resistor, and said series combination is connected between the other end of said first resistor and the power source for supplying the first voltage.

28. A high-speed logic circuit according to claim 25, wherein each of said logic part and said feedback circuit is connected between the first and second voltage power sources.

29. A high-speed logic circuit according to claim 25, further comprising a first emitter-follower transistor applied with a collector signal of an out-of-phase input transistor which is included in said differential transistor circuit.

30. A high-speed logic device according to claim 29, further comprising a second emitter-follower transistor applied with a collector signal of at least one in-phase input transistor which is included in said differential transistor circuit.

31. A high-speed logic circuit according to claim 27, further comprising means for supplying a bias voltage to the base of said second transistor to prevent the output of said differential transistor circuit from being affected by supply-voltage variations and temperature variations.

32. A high-speed logic circuit according to claim 26, wherein said logic part includes a constant current source circuit provided between said differential transistor circuit and the first voltage power source for supplying constant current to said differential transistor circuit.

33. A high-speed logic circuit comprising:
a logic part formed of a differential transistor circuit for receiving an input signal and a reference voltage to provide an in-phase output;

a feedback part for providing negative feedback of said in-phase output of said differential transistor circuit, said feedback part including a first transistor applied with the in-phase output of said differential transistor circuit;

a first resistor connected at one end thereof to the emitter of said first transistor and at the other end thereof to the base of a phase-shifting input transistor included in said differential transistor circuit and a first constant current source for keeping the current flowing through said first transistor and said first resistor constant; and a second transistor coupled in parallel to said first transistor and said first resistor.

34. A circuit as claimed in claim 33, wherein said logic part and said feedback part are coupled between a common negative power source and a common positive power source.

35. A circuit as claimed in claim 34, wherein said logic part includes a constant current source formed of a series combination of a third transistor and a second resistor for supplying current to said differential transistor circuit, and said first constant current source is formed of a series combination of a fourth transistor and a third resistor, wherein said third and fourth transistors have substantially the same emitter current density.

36. A circuit as claimed in claim 33, further comprising a first emitter-follower transistor applied with the collector signal of said phase-shifting input transistor and a second emitter-follower transistor applied with the collector signal of in-phase input transistors included in said differential transistor circuit; said first transistor having substantially the same emitter current density as each of said first and second emitter-follower transistors.

37. A circuit according to claim 33, wherein said constant current source circuit is formed of a series combination of a third transistor and a second resistor, and said series combination is connected between the other end of said first resistor and the power source for supplying a predetermined voltage.

38. A circuit according to claim 33, further comprising a first emitter-follower transistor applied with a collector signal of an out-of-phase input transistor which is included in said differential transistor circuit.

39. A circuit according to claim 33, further comprising a second emitter-follower transistor applied with a collector signal of at least one in-phase input transistor which is included in said differential transistor circuit.

40. A circuit according to claim 33, further comprising means for supplying a bias voltage to the first constant current source to prevent the output of said differential transistor circuit from being affected by supply-voltage variations and temperature variations.

* * * * *